US008225850B2

(12) United States Patent  (10) Patent No.: US 8,225,850 B2
Lofland et al.  (45) Date of Patent: Jul. 24, 2012

(54) ATTACHMENT METHOD FOR FAN COMPONENT ASSEMBLIES

(75) Inventors: Steven J. Lofland, Portland, OR (US); Mark S. Van Sickle, Beaverton, OR (US)

(73) Assignee: Intel Corporation, Santa Clara, CA (US)

(\*) Notice: Subject to any disclaimer, the term of this patent is extended or adjusted under 35 U.S.C. 154(b) by 216 days.

(21) Appl. No.: 12/813,447

(22) Filed: Jun. 10, 2010

(65) Prior Publication Data

US 2010/0242281 A1 Sep. 30, 2010

Related U.S. Application Data

(63) Continuation of application No. 11/541,136, filed on Sep. 29, 2006, now Pat. No. 7,789,126.

(51) Int. Cl.
*F04D 29/60* (2006.01)
*F03D 11/04* (2006.01)
(52) U.S. Cl. ........ 165/121; 361/697; 415/176; 415/177; 415/213.1
(58) Field of Classification Search .................. 165/80.3, 165/121; 361/697
See application file for complete search history.

(56) References Cited

U.S. PATENT DOCUMENTS

| 5,421,402 | A | 6/1995 | Lin |
| 5,484,013 | A | 1/1996 | Morikawa et al. |
| 5,522,700 | A | 6/1996 | Hong |
| 5,615,998 | A | 4/1997 | Kodama et al. |
| 5,724,228 | A | 3/1998 | Lee |
| 5,835,347 | A | 11/1998 | Chu |
| 5,943,209 | A | 8/1999 | Liu |
| 6,137,680 | A | 10/2000 | Kodaira et al. |
| 6,302,189 | B1 | 10/2001 | Lin et al. |
| 6,330,905 | B1 | 12/2001 | Lin et al. |
| 6,341,644 | B1 | 1/2002 | Lo et al. |
| 6,375,418 | B1* | 4/2002 | Watanabe et al. .......... 415/213.1 |
| 6,392,885 | B1 | 5/2002 | Lee et al. |
| 6,434,002 | B1* | 8/2002 | Wei ............................... 361/697 |
| 6,520,250 | B2 | 2/2003 | Lee et al. |
| 6,587,341 | B1 | 7/2003 | Wei |
| 7,063,130 | B2 | 6/2006 | Huang |
| 7,117,932 | B2 | 10/2006 | Ku et al. |
| 7,160,080 | B2 | 1/2007 | Lin |
| 7,221,567 | B2 | 5/2007 | Otsuki et al. |

(Continued)

OTHER PUBLICATIONS

Intel Corporation, Non Final Office Action dated Nov. 24, 2009; U.S. Appl. No. 11/541,136.

*Primary Examiner* — Leonard R Leo
(74) *Attorney, Agent, or Firm* — Blakely, Sokoloff, Taylor & Zafman LLP

(57) ABSTRACT

A fan attachment is provided to attach a fan assembly to a cap of a heat exchanger. The fan attachment includes a feature to manage wires going to the fan motor, a notch for a thermister to sense temperature, snap hooks to be engaged by receiving tabs of the cap, a keying shear load feature to radially align the fan attachment and cap, and Z-height tolerance springs to bias the fan attachment away from the cap. The cap has features to interact with those of the fan attachment, including receiving tabs. The fan attachment may be manually aligned and forced so that the snap hooks are received and engaged by the receiving tabs. Additionally, the snap hooks and keying feature are, in combination, capable of supporting fan and attach mechanism in an undamaged condition during 25 g-force shock to the heat exchanger.

20 Claims, 6 Drawing Sheets

U.S. PATENT DOCUMENTS

| | | |
|---|---|---|
| 7,278,209 B2 | 10/2007 | Otsuki et al. |
| 7,333,333 B2* | 2/2008 | Zhao et al. .................... 361/700 |
| 7,563,070 B2 | 7/2009 | Lin et al. |
| 7,597,535 B2* | 10/2009 | Wu et al. .................... 415/213.1 |
| 2002/0011326 A1 | 1/2002 | Matsumoto |
| 2002/0182068 A1 | 12/2002 | Liu |
| 2004/0108104 A1 | 6/2004 | Luo |
| 2004/0136163 A1* | 7/2004 | Horng et al. .................. 361/697 |
| 2004/0173339 A1 | 9/2004 | Cheng |
| 2005/0271506 A1 | 12/2005 | Pan |
| 2006/0021733 A1 | 2/2006 | Huang |
| 2006/0021740 A1 | 2/2006 | Chi-Hsueh |
| 2006/0219386 A1 | 10/2006 | Hsia et al. |
| 2007/0086888 A1* | 4/2007 | Patel et al. .................... 415/177 |

* cited by examiner

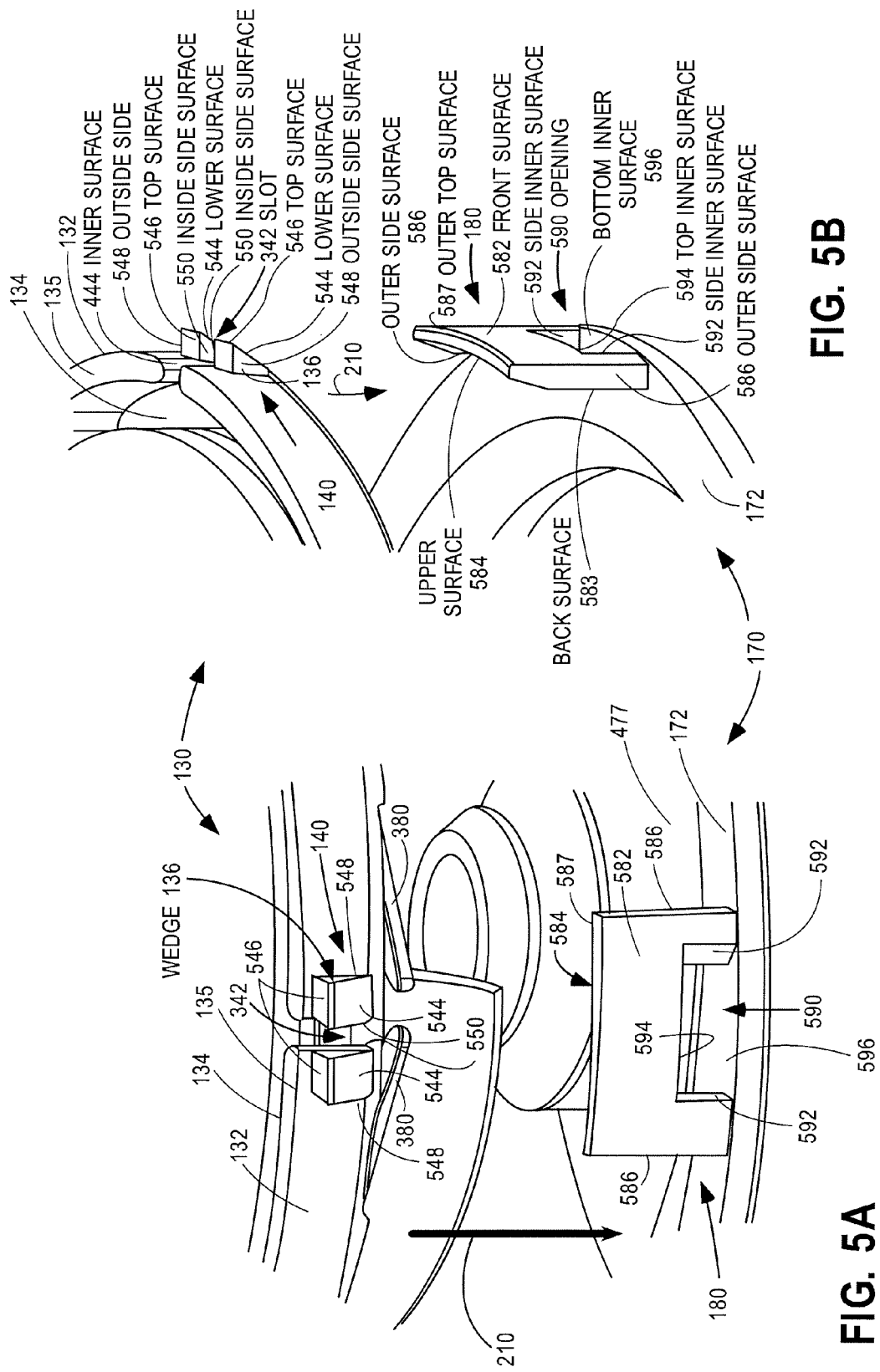

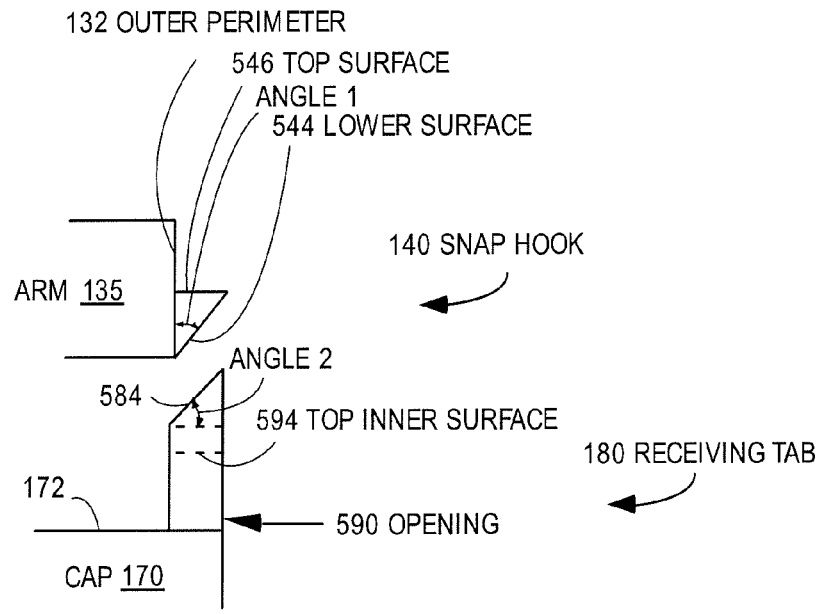
FIG. 6A
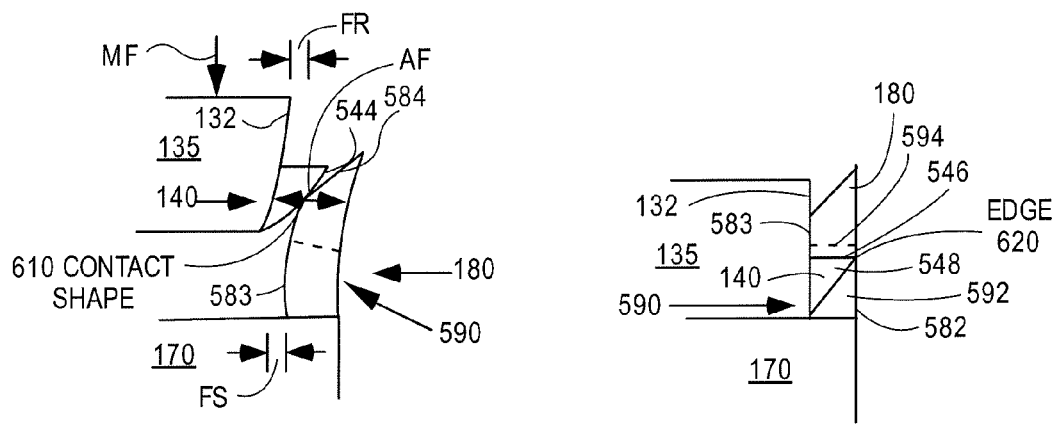
FIG. 6B     FIG. 6C

ATTACHMENT METHOD FOR FAN COMPONENT ASSEMBLIES

CROSS REFERENCE TO RELATED APPLICATION

This application is a Continuation application of U.S. patent application Ser. No. 11/541,136, filed Sep. 29, 2006 issued as U.S. Pat. No. 7,789,126 on Sep. 7, 2010.

BACKGROUND

1. Field

One or more embodiments related generally to components and component assemblies for cooling electronic devices. More particularly, one or more embodiments relate to fan component assemblies, such as for attaching a fan assembly to a heat exchanger assembly of a computer.

2. Background

Electronic devices, such as computing devices, often require cooling of electronic circuitry, components, chips, disc drives, power transformers, and the like. Computing devices contemplated include personal computers (PC), desktop computers, computing systems, portable computing devices, handheld computing devices, telephones, cellular phones, game devices, Internet related computing devices, servers, televisions, video monitors or displays, digital video disk (DVD) players, set top boxes, as well as video storage and editing devices. In some cases, the computing device will have a main memory coupled to a processor, an operating system and other application programs to be executed by the processor.

For example, a printed circuit board (PCB), semiconductor chip package, semiconductor chip, power transformer, processor, central processing unit (CPU), memory chip, or other electronic device of a computer may be thermally coupled or attached to a heat exchanger that is cooled by a fan, such as by the fan blowing air onto the heat exchanger.

Typically, such fans are mounted independently of the heat exchanger or electronic device or devices they are to cool. For instance, a fan may have a cowling or external frame with holes running through the corners of the frame to allow the fan and frame to be attached to internal structure or the case of a computer. Specifically, current fans typically include a frame around the blade component, and a pattern of holes in the corners of the frame component to allow the fan to be fastened to the computer by putting mounting hardware, such as screws or other similar hardware through the holes and into the frame or internal structure of the computer.

However, such fan and frame assemblies require a frame for attachment to the computer; are not attached and/or proximate to a heat sink; and may not provide adequate cooling capacity or power, and thus may be unable to provide more than 100 watts of cooling.

BRIEF DESCRIPTION OF THE DRAWINGS

Various features, aspects and advantages will become more thoroughly apparent from the following detailed description, the set of claims, and accompanying drawings in which:

FIG. 5a is side perspective view of snap hooks of a fan attachment and receiving tabs of a cap.

FIG. 5b is another side perspective view of snap hooks of a fan attachment and receiving tabs of a cap.

FIG. 6a is a cross-sectional schematic view of a snap hook of a fan attachment and the receiving tab of a cap prior to the receiving tab receiving the snap hook.

FIG. 6b is a cross-sectional schematic view of a snap hook of a fan attachment and a receiving tab of a cap during the receiving tab receiving of the snap hook and prior to the receiving tab engaging the snap hook.

FIG. 6c is a cross-sectional schematic view of a snap hook of a fan attachment and a receiving tab of a cap after receiving tab receiving of the snap hook and during receiving tab engaging of the snap hook.

DETAILED DESCRIPTION

Figure 1:
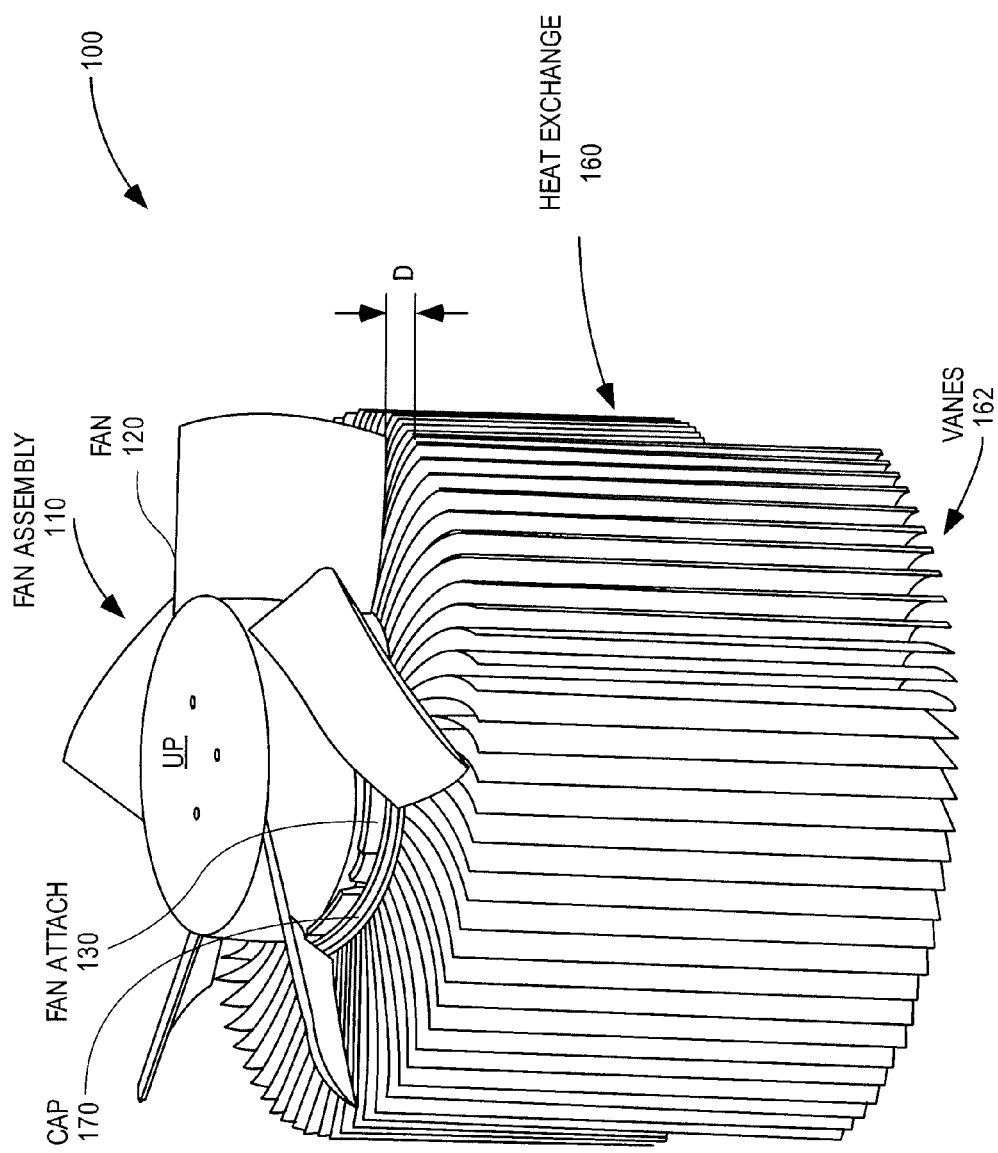
FIG. 1 is a side perspective view of a fan assembly attached to a cap of a heat exchanger by a fan attachment component.

According to embodiments, a fan or a fan assembly may be attached to a heat sink or heat exchanger using a "fan attachment". The fan attachment may be described as an apparatus or component of a system including a cap and/or heat exchanger apparatus or component. Specifically, the heat exchanger may be part of a heat exchanger assembly having a cap and the fan may be part of a fan assembly having a fan, where each assembly has various features, including features for alignment, receipt and engagement to couple or attach one assembly to the other assembly. For example, the fan attachment may include various features such as a wire management feature, a thermister notch, snap hooks, a keying shear load feature, Z-height tolerance springs, a receiving tab feature, and/or a keying feature. Also, the fan assembly (which may include the fan attachment) may exclude or not require a cowling or frame, such as for mounting the fan to internal structure or a frame of a computer, because the fan attachment provides sufficient mounting of the fan assembly to the heat exchanger. Moreover, the proximity and direct attachment or mounting of the fan assembly to the heat exchanger (e.g., such as by the fan attachment touching, engaging, or being directly attached or connected to a cap of the heat exchanger) allows for increased cooling. Specifically, using such an arrangement, the proximity of the location of the fan to the heat exchanger causes more of the air blown by the fan to go into the heat exchanger, than locating the fan farther from the heat exchanger. For instance, the proximity of the fan to the heat exchanger may be a factor contributing to the system of the exchanger and fan producing a higher performing heat exchange, such as producing cooling of equal to or greater than 100 watts of power. Also, the proximity of the fan to the heat exchanger may cause most (e.g., more than 50, 60, 70, 80, or 90 percent) of the air blown by the fan to go into the heat exchanger.

Reference in the specification to "embodiment", "embodiments", "one embodiment", and "an embodiment" of the present invention means that a particular feature, component, structure, or characteristic described in connection with the embodiment is included in at least one embodiment of the present invention. Thus, the appearance of those phrases in various places throughout the specification are not necessarily all referring to the same embodiment. Moreover, in some cases, the fan attachment may be considered a component, a fan component, a part of a fan component assembly or fan assembly of an electronic device or computer to be attached to a heat exchanger, a component of a heat exchanger, or a cap of a heat exchanger of an electronic device or computer.

Also, directional references such as top, side, bottom, upper, lower, vertical, horizontal, outer, inner, above, below, beside, within, and the like may be relative terms, such as with regard to the disposition or orientation of various features or component. Thus, such terms are not to be limiting, but are to provide an example of such orientations, positions, locations, and descriptions. For instance, although certain descriptions and drawing show the heat exchanger, cap, fan attach and fan (e.g., components of the system) in vertical alignment, such as disposed or mounted on a horizontal surface with respect to the surface of the Earth, it is also considered that the may be disposed or mounted on a surface other than horizontal, such as a vertical or angled surface. Thus, descriptions of up, down, top, bottom, vertical, horizontal and the like are relative terms and may have other meanings when the components of the system are mounted other than in vertical alignment.

FIG. 1 is a side perspective view of a fan assembly attached to a cap of a heat exchanger by a fan attachment component. FIG. 1 shows system 100 including fan assembly 110 attached to heat exchanger 160. Fan assembly 110 includes fan 120 and fan attachment 130. Heat exchanger 160 includes cap 170, such as to index with, attach to, and allow features to work together with a fan attachment or a fan assembly. Heat exchanger 160 may also include vanes 162 such as to provide increased cooling surface area for the fan to blow air upon to increase cooling capability of the heat exchanger 160 and fan assembly.

Fan attachment 130 is attached to cap 170, and vice versa, thus attaching fan assembly 110 to heat exchanger 160, and vice versa. Fan attachment 130 may also be described as attached to (and/or between) cap 170 of the heat exchanger and fan 120. For example, a number of snap hooks of fan attachment 130 may be engaged by a number of receiving tabs of cap 170 to secure, engage, attach, hold, or mount fan assembly 110 (e.g., fan attachment 130) to exchanger 160 (e.g., cap 170). Prior to such engaging, the snap hooks may be aligned with, mated with, or received by the receiving tabs. For instance, fan attachment 130 may be indexed, or aligned with cap 170 so that the snap hooks are aligned, mate with, or are received by receiving tabs of cap 170. Then, or during receiving of the snap hooks by the receiving tabs, upper portion UP of fan 120 may be pushed downwards towards exchanger 160 until the snap hooks are engaged, held, secured, attached, or mounted to the receiving tabs. Also, cap 170 may define a cylinder or cylindrical perimeter (or another perimeter matching the shape of perimeter 132) under the fan attachment.

Fan attachment 130 may be considered a component of fan assembly 110 and cap 170 may be considered a component of heat exchanger 160. Fan assembly 110 may include various other components, and components of fan assembly 110 may include various features. For example, fan assembly 110 may include a motor, a fan control (such as circuitry on a printed circuit board (PCB)) for controlling the speed of fan 120, a bearing to allow fan 120 to spin with respect to fan attachment 130, the motor, cap 170, and/or heat exchanger 160.

Similarly, heat exchanger 160 may include components other than cap 170 having various features. For example, heat exchanger 160 may be attached to, coupled to, thermally coupled to, or otherwise provide cooling for an electronic device, such as a chip package, semiconductor chip, and/or a processor. Specifically, a chip package may be mounted below heat exchanger 160 and thermally connected to heat exchanger 160 such as by thermally conductive epoxy, attachment, or contact between the heat exchanger and the package.

Heat exchanger 160 may be, or may be part of a heat exchanger assembly (e.g., an assembly having more components than shown or described herein). In some cases, heat exchanger 160 may provide liquid cooling, and/or be a liquid cooling heat exchanger. Thus, it can be appreciated that coolant lines may extend from heat exchanger 160 to be thermally coupled to an electronic device, thus providing for cooling of the device. For instance, vanes 162 may be thermally coupled to a processor using a liquid coolant and/or a solid heat exchange material.

Fan 120 may be a cooling fan for moving or blowing air such as to spin in a counter-clockwise direction to blow air onto or into heat exchanger 160. Fan 120 may have a mass of between 50 and 100 grams, such as a mass of approximately 75, 80, 84, 86, 88, 90, 95 grams, or a mass in a range between any of those numbers. Although fan 120 is shown having five fan blades, it can be appreciated that fan 120 may include more or less than five blades, such as by having two, three, four, six, eight, or ten blades. Similarly, heat exchanger 160 is shown having a number of cooling vanes 162 extending radially away from cap 170 below fan 120, and for an axis running upwards through the center of heat exchanger 160. For instance, cap 170 may define or form a cylinder within heat exchanger 160, below fan attachment 130.

FIG. 1 shows fan assembly 110, fan 120, fan attachment 130, cap 170, and/or heat exchanger 160 in their expected use disposition or orientation. Specifically, fan attachment 130 is attaching assembly 110 to exchanger 160 such that fan 120 may rotate at a sufficient speed (e.g., rotational speed in a counter-clockwise direction) to blow a sufficient amount of air or move a sufficient amount of air onto, into, or through heat exchanger 160 to provide a desired amount of cooling. The desired amount of cooling may be providing cooling of 50, 60, 70, 80, 90, 100, 110, 120, 130, watts or a range between any of those numbers of watts of cooling. For example, an actual cooling capacity for the components of FIG. 1 may provide 130 watts of cooling, such cooling or cooling greater than that typically experienced by a fan arrangement, such as described in the background, may be increased since fan assembly 110 is attached to, proximate to, or separated only by distance D from the top of heat exchanger 160 (see also discussion of distance D in FIG. 4). Distance D may define a height or proximity between the bottom of the blades of fan 120 and the top of vanes 162 of exchanger 160.

Figure 2:
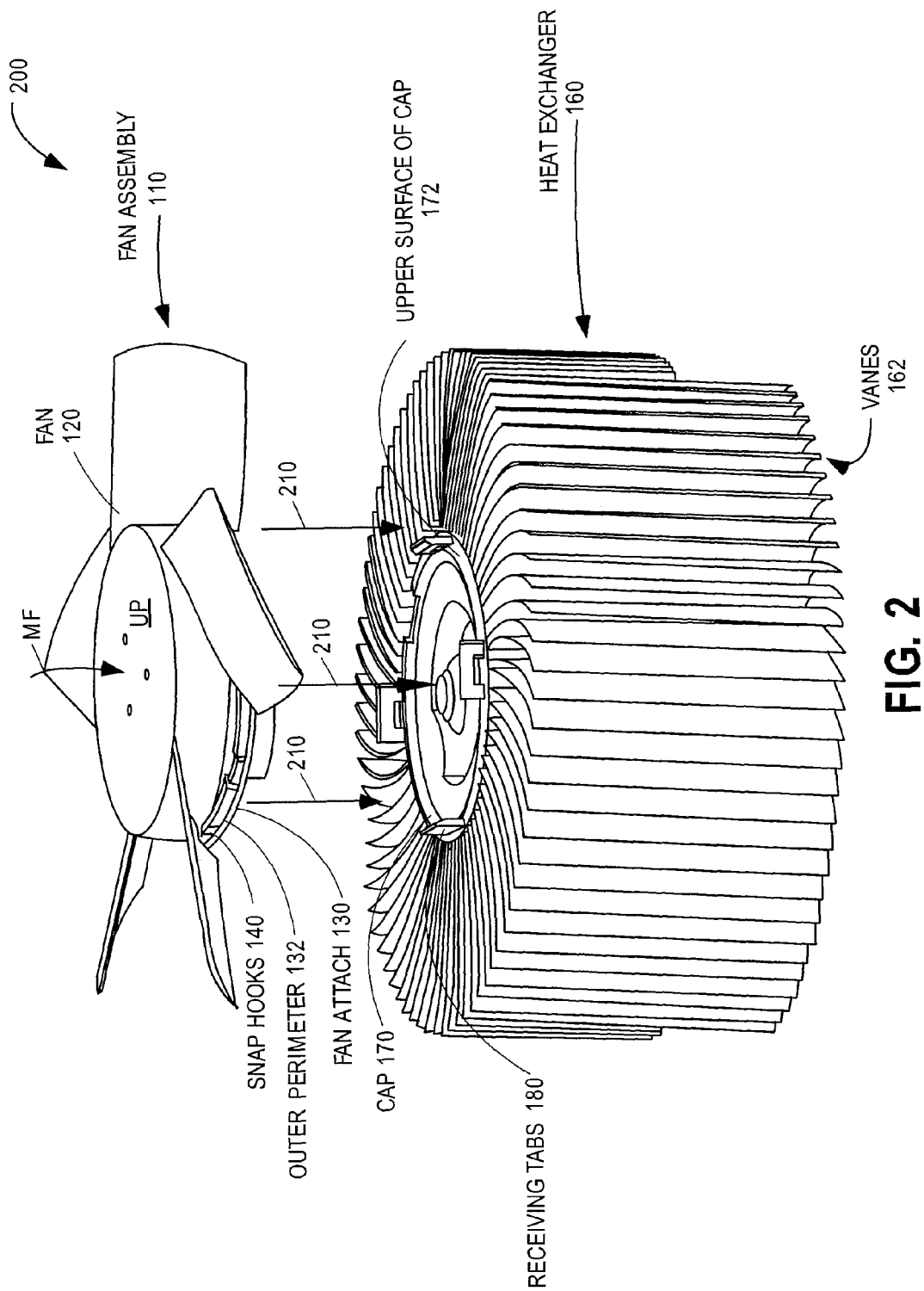
FIG. 2 shows the fan assembly, cap, fan attachment, and heat exchanger of FIG. 1 prior to attachment of the fan attachment to the cap.

FIG. 2 shows the fan assembly, cap, fan attachment, and heat exchanger of FIG. 1 prior to attachment of the fan attachment to the cap. FIG. 2 shows system 200 including fan assembly 110 prior to attachment of that assembly to heat exchanger 160. Thus, in FIG. 2, snap hooks of fan attachment 130 may not yet be received by or engaged by snap hooks of cap 170. FIG. 2 shows fan attachment 130 including outer perimeter 132 and snap hooks 140.

FIG. 2 also shows vanes 162 of exchanger 160. Heat exchanger 160 may have more or less vanes than that shown in FIG. 1 or 2. It is also considered that fan attachment 130 and/or cap 170 may be coupled to various other types of heat exchangers or electronic devices, such as where cap 170 is a component of, part of, or attached to a different type or shape of heat exchanger or electronic device.

Outer perimeter 132 may define or form an outermost perimeter surface, perimeter, or shape of fan attachment 130 (which may or may not exclude certain features of fan attachment 130, such as a wire management feature). Snap hooks 140 may represent a pair of snap hooks at two, three, four, five, six, or more locations around the perimeter of outer perimeter 132.

Cap 170 is shown having receiving tabs 180 formed on or in upper surface 172 of cap 170. Surface 172 may be described as a disc shaped surface (e.g., of a cylindrically shaped cap portion) that the tabs extend perpendicularly away from (e.g., up and away from the disc shaped surface). Although FIG. 2 shows four receiving tabs, it can be appreciated that more or less receiving tabs, such as two, three, four, five, six, or more receiving tabs may be used. Specifically, a receiving tab may exist at upper surface 172 for each pair of snap hooks 140. For instance, a receiving tab may be located on cap 170 at a location of (or a location "corresponding" to) a location of each pair of snap hooks, such as to receive and engage each pair of snap hooks once properly indexed (e.g., by keying and shear load 370, keying feature 475, and or surfaces of the snap hooks and tabs as described herein).

For instance, outer perimeter 132 may define a cylinder, oval, circular, square, polyhedron, or other perimeter surface or shape having arms ending in snap hooks to be received and engaged by receiving tabs 180. The majority of the outer surface of perimeter 132 may be flat and/or have texture. The majority of the outer surface of perimeter 132 may have a cross sectional shape that is or is not vertically planar. In some cases, the outer surface of perimeter 132 may form the outside of a cylindrical shape broken only by the snap hooks, slots and other features of fan attachment 132 described herein. Alternatively, the outer surface of perimeter 132 may also be broken by other features not mentioned herein.

FIG. 2 also shows arrows 210 that may represent the direction, force, and/or pressure for attaching fan attachment 130 to cap 170. For example, arrows 210 may represent manual force MF shown being applied to upper portion UP of fan 120 in order to have snap hooks 140 received by and engaged by receiving tabs 180. Manual force MF may be a force of between 2 and 3.7 pounds of pressure on upper portion UP, such as by being 2.0, 2.2, 2.4, 2.6, 2.8, 3.0, 3.2, 3.4, 3.6, 3.7, or a range between any of those numbers of pounds of pressure applied to upper portion UP. For example, manual force, MF may be created by a person, machine, or robot pressing on upper portion UP. Similarly, arrows 210 may represent a force as described above for manual force MF, such as where the force is generated other than at upper portion UP of fan 120. Thus, arrows 210 may represent a force capable of being generated by a person, such as the force with which snap hooks 140 are pressed towards receiving tabs 180 such as to be received by and engaged by receiving tabs 180.

It is considered that attachment of assembly 110 or fan attachment 130 to exchanger 160 or cap 170 may be described by receiving and/or engagement of snap hooks 140 by receiving tabs 180. In some cases, such attachment may also include lifting or biasing of the fan attachment away from the cap by springs, such as will be described later.

Figure 3:
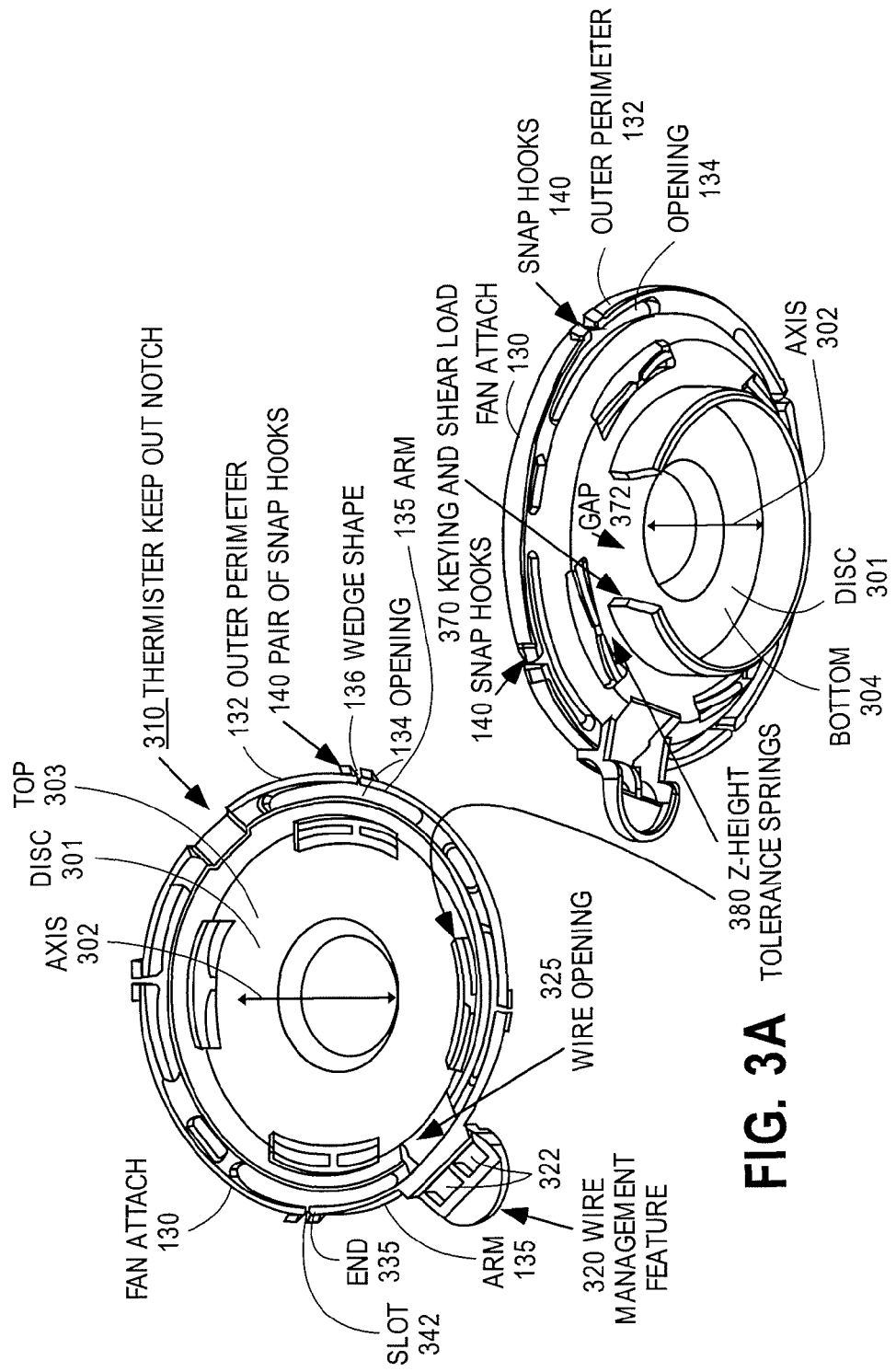
FIG. 3a is a top perspective view of a fan attachment.
FIG. 3b is a bottom perspective view of a fan attachment.

FIG. 3a is a top perspective view of a fan attachment. FIG. 3b is a bottom perspective view of a fan attachment. FIGS. 3a and 3b show fan attachment 130 having generally disk shape 301 around center axis 302, top surface 303 and bottom surface 304. Radially distal from axis 302 is outer perimeter 132, such as a ring shaped outer perimeter, having a number or arms, such as arm 135 of the outer perimeter surface. One or more of anus 135 may define openings 134 in or through the disk shape between axis 302 and outer perimeter 132 (e.g., between axis 302 and arms 135). It may also be said that outer perimeter 132 or an inner ring surface of arms 135 may define openings 134, where the openings exist. Arms 135, ends 335 of arm 135, and/or portions of outer perimeter 132 may define or be separated by slot 342 through the outer perimeter surface and to an opening of openings 134. Specifically, adjacent ends 335 of adjacent arms 135 may define a slots through outer perimeter surface 132 and to opening 134. Pairs of adjacent snap hooks 140 are on the outer perimeter surface, where each snap hook has wedge shape 136 pointing from top surface 303 towards bottom surface 302 and extends radially outwards from outer perimeter surface 132 on either side of the slot. Fan attachment 130 also includes wire management feature 320, thermister keep out notch 310, pairs of snap hooks 140, keying and shear load 370, and Z-height tolerance springs 380.

FIGS. 3a and 3b also show thermister keep out notch 310 defined by surfaces of fan attach 130 and having a geometry and/or surfaces to provide an opening, location or clearance for locating or mounting a thermister component for sensing the ambient air around the fan. The thermister component can be electrically (e.g., using wires) attached to the fan motor or fan motor control PCB to provide feedback or temperature data sensed for the ambient air around the fan so that a fan speed (e.g., revolutions per minute (RPM)) may be select or set to provide sufficient cooling or a sufficient amount of air into exchanger 160. It can be appreciated that although surfaces defining notch 310 are shown defining a rectangular notch, various other shapes and sizes may be used, as long as the shape and size is sufficient for receiving and retaining a thermister (e.g., such as a shape equal to a x-section of the mister).

Wire management feature 320 includes or defines openings 322 and 325 such as to route power and control wires from a fan motor of a fan coupled to the fan attachment (or a fan motor PCB for controlling the fan) to a power header for plugging into a power source. Thus, feature 320, surfaces defining opening 322 and/or opening 325 may prevent the wires from contacting blades of the fan as they rotate, such as by providing or defining openings to route the wires out of the fan assembly, under the fan blades, and/or into the heat exchanger.

FIGS. 3a and 3b also show snap hooks 140 each having wedge shape 136, and opening 134 behind outer perimeter 132 where snap hooks 140 are located at or on perimeter 132. Snap hooks 140 may be described as having wedge shape 136 located on, pointing down along, and/or extending outwards from outer perimeter surface 132 (e.g., at locations at which snap hooks are located on perimeter 132). Each of the snap hooks of the pair may be described as pairs of adjacent snap hooks on either side of a slot or opening through or dividing arms 135 along or of perimeter 132. Thus, in addition to being defined by other structures such as arms, arm ends, and the out perimeter surface, a slot may also be defined by adjacent snap hooks. FIGS. 3a and 3b show four pair for a total of eight snap hooks, although other numbers of pairs greater or less than four pair are considered.

The snap hooks may be described as mounted or located on perimeter 132 (e.g., as a wedge shape pointing down) at the end of arms 135. A snap hook may be described as a wedge shape pointing down along perimeter 132 at the end of arm 135. Arm 135 may be an arm of fan attachment 130 defined by or part of perimeter 132. Also, arm 135 may define perimeter 132, opening 134 and the slot separating the snap hook from the adjacent snap hook (and the end of the adjacent arm). Arm 135 may be sufficiently flexible so a force or pressure on the snap hook (e.g., such as inwards towards the axis or center of the fan attachment) causes the arm to flex or move back (e.g., at the end of the arm where the snap hook is) into opening 134.

The arm flexing or moving back may include or also be described by saying that the snap hook flexes or moves back, and vice versa.

FIGS. 3a and 3b also show keying and shear load 370 defining gap 372 to properly align fan attachment 130, with an index or a protrusion of cap 170 having receiving tabs 180. For instance, surfaces defining gap 372 may be used to index or properly align fan attachment 130, radially, with an index or a protrusion of cap 170 so that snap hooks of fan attachment 130 are properly align, radially, with receiving tabs of cap 170.

FIGS. 3a and 3b also show Z-height tolerance springs 380, such as springs having a sufficient spring force "k" to keep fan attachment 130, fan assembly 110, and/or components thereof from rattling or reduce an amount of rattling caused by clearances between cap 170 and fan attachment 130. Keeping from ratting or reducing rattling can be accomplished or caused by the springs, collectively, forcing, pressing, or lifting fan attachment 130 away, up, and/or vertically away from receiving tabs 180, to hold surfaces, such as top surfaces, of snap hooks 140 against a top inner surface of the receiving tabs. Thus, the collective force may be sufficient to ensure that a fan coupled to fan attachment 130 is at a known position relative to the heat exchanger (e.g., in three dimensional location, with respect to the "yawl" axis or rotational axis of the fan), such as to have the bottom of blades of the fan at a known distance D (see FIG. 1) in height above the top surfaces of vanes of the heat exchanger. It can be appreciated that the springs can perform a similar function for keeping the blades above structures, electronic devices, or other cooling components in addition to a heat exchanger, such as when a heat exchanger is not used. It can be appreciated that although springs 380 are shown having four springs, various numbers of springs, such as two, three, five, six, eight, or more springs may be used, as long as the springs provide a similar force for performing the functions described above.

Figure 4:
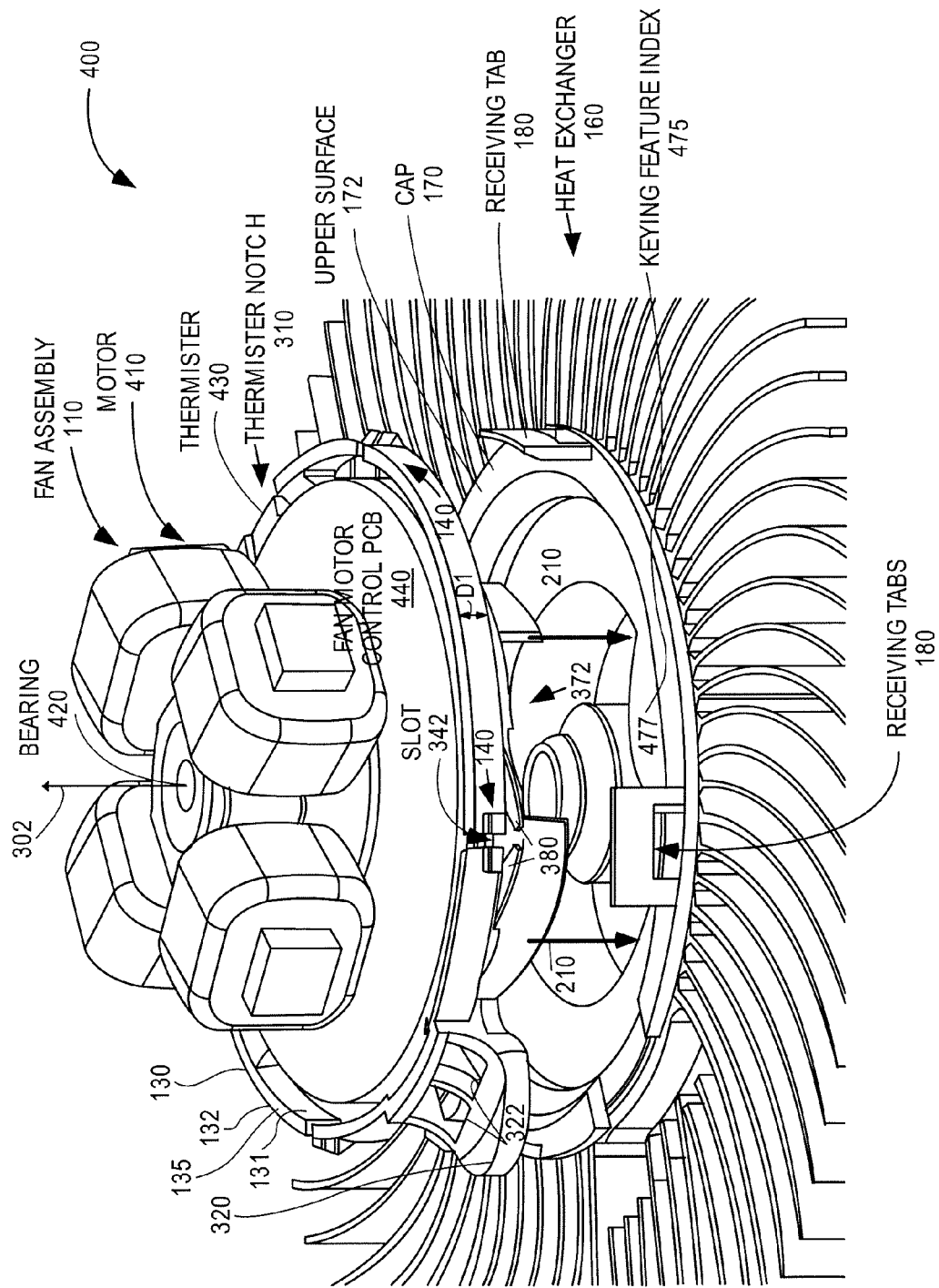
FIG. 4 is a side perspective view of fan assembly components, a fan attachment, a cap, and a heat exchanger prior to attachment of the fan attachment to the cap, showing snap hooks of the fan attachment and receiving tabs of the cap to receive and engage the snap hooks.

FIG. 4 is a side perspective view of fan assembly components, a fan attachment, a cap, and a heat exchanger prior to attachment of the fan attachment to the cap, showing snap hooks of the fan attachment and receiving tabs of the cap to receive and engage the snap hooks. FIG. 4 shows system 400 including components of fan assembly 110 and heat exchanger 160. Specifically, motor 410, bearing 420, thermister component 430, fan motor control PCB 440, and fan attachment 130 of fan assembly 110 are shown. Similarly, cap 170 of heat exchanger 160 is shown. FIG. 4 also shows features of fan attachment 130 including outer perimeter 132, opening 134, thermister notch 310, snap hooks 140, slot 342, and wire management feature 320. Slot 342 may represent a slot between, separating, or dividing a pair of snap hooks, such that each snap hook or wedge shape of each snap hook may point down along and extend outwards from perimeter 132 on either side of slot 342.

Also, as shown in FIG. 4, surfaces defining thermister notch 310 may have a geometry, size and surfaces to provide clearances for thermister component 430, which may be attached to or part of PCB 440 for sensing the ambient air (e.g., a temperature of the air) around the fan so that the circuitry of PCB 440 can set or change the fan speed to provide sufficient cooling to heat exchanger 160.

As shown in FIG. 4, management feature 320 may include or define openings to mount wires from motor 410 and/or PCB 440 to a power header (not shown). Although feature 320 is shown having a curved shape, surfaces defining two openings at openings 322, and surfaces defining one opening for opening 325, it can be appreciated that various other shapes, surfaces defining openings, and/or numbers of openings may be used for feature 320. Moreover, feature 320 may include structures to fix and/or restrain the wires, such as wherein the openings are smaller, include rubber, or other structure to hold or restrain a wire from being pulled one direction or another through feature 320.

Motor 410 may be a motor that rotates with fan 120 or rotates a shaft attached to fan 120. Motor 410 may be a motor for spinning a fan with sufficient speed, or RPMs, to provide cooling as described herein. Bearing 420 may be a bearing for rotating fan 120. PCB 440 may be a PCB including circuitry, logic, and/or control circuitry to control the speed of rotation of fan 120 as described herein. Also, thermister component 430 may be a thermister to fit within surfaces defining thermister notch 310 and may provide sufficient feedback or signal of the ambient air around fan 120 to allow PCB 440 to adjust the speed of the fan to provide sufficient cooling. Specifically, the rotational speed of the fan may be increased to provide additional cooling (e.g., increase a rate of cooling of exchanger 160) when the ambient temperature around the fan exceeds a high temperature threshold; and/or decreased to reduce cooling (e.g., decrease a rate of cooling of exchanger 160) when the ambient temperature around the fan is below a low temperature threshold.

As shown in FIG. 4, gap 372 defined by surfaces of keying and shear load feature 370 may align fan attachment 130 with cap 170. The surfaces defining gap 372 may align with or index protrusion 477 defined by surfaces of keying feature index 475 of cap 170. It can be appreciated that although keying and shear load 370 is shown defining gap 372 with a certain size and shape, various sizes and shapes for gap 372 may be used as long as they are sufficient for being indexed by an index or protrusion. In some cases, although protrusion 477 is shown having a curved shape, it can be appreciated that protrusion 477 can have various shapes and/or sizes as appropriate for indexing or being engaged by surfaces of keying and shear load 370 that define gap 372. Specifically, feature 370, surfaces defining gap 372, index 475 and/or protrusion 477 may have surfaces, shape, size, and/or material sufficient to index fan attachment 130 during receiving and engaging of snap hooks 140 by receiving tabs 180 to resist rotation and/or provide shear resistance for fan attachment 130 with respect to cap 170. For instance, engagement of protrusion 477 and surfaces defining gap 372 (e.g., during or while snap hooks engage index tabs) may prohibit rotation and/or provide shear resistance for fan attachment 130 with respect to cap 170 during rotation of fan 120, such as during use of fan 120, during or as a result of a 20 g-30 g shock (e.g., such an from an impact in any direction, to a computer case or motherboard on which the heat exchanger is mounted), without damaging material and/or surfaces defining gap 372 and/or protrusion 477.

Also, snap hooks 140 may have a wedge shape and/or surfaces to be received by and engaged by openings defined by receiving tabs 180 so that the snap hooks snap-in or spring-snap into the receiving tabs and/or engaged by the receiving tabs to resist rotation and provide shear resistance for the fan attachment during rotation of the fan. For instance, the snap hooks may be snap-in type hooks or spring snap type hooks to snapped into opening of the receiving tabs (e.g., into surfaces defining the openings) to maintain attachment of the fan to the heat sink.

Also, the indexing by feature 370 and index 475, and/or engagement of snap hooks 140 by receiving tabs 180 may provide sufficient resistance of rotation, shear resistance, indexing, engagement of snap hooks by receiving tabs, and/or attachment of fan attachment 130 by cap 170 to retain or maintain indexing, engagement and/or attachment during a shock to an electronic device, motherboard, system board, PCB, casing, outer surfaces, or inner structure of an electronic or computer device to which heat exchanger 160 and/or cap 170 are coupled, attached, or mounted (e.g., such as being thinly and directly connected to transfer the shock). Specifically, the indexing, engagement, and/or attachment may be sufficient to be retained or maintained during a 20 g (e.g., a "G" force or force of the acceleration of the Earths gravity upon an object near the surface of the Earth, which is considered one "g"), 25 g, 30 g, 35 g, or a g-forces shock in a range between any of those numbers in any direction to the electronic device, system board, or computer to which cap 170 is coupled. This the indexing, engagement, and/or attachment of the snap hooks and keying feature, in combination, may be capable of supporting fan and attach mechanism in an undamaged condition during 25 g-force shock to the heat exchanger. Similarly, the indexing, engagement, and/or attachment may be sufficient to be retained or maintained while providing cooling as described herein. The receiving and engagement of snap hooks by receiving tabs is described further below.

FIG. 4 also shows Z-height tolerance springs 380 to keep from rattling or reduce rattling of fan attachment 130, bearing 420, motor 410, thermister component 430, PCB 440, and/or feature 320 by lifting fan attachment 130 away from receiving tabs 180, surface 172, and/or cap 170 (e.g., biasing the fan attachment away from the receiving tabs so that surfaces 546 engage surfaces 594 of FIG. 5). Specifically, FIG. 4 shows distance D1 as the height of outer perimeter 132 of fan attachment 130. In some cases distance D may equal distance D1. It can be appreciated that distance D may be a higher less than or great than the height of perimeter 132. For instance, distance D may be a height of 1, 2, 3, 8, 10, 20, 40, 80 millimeters (mm), or any combination of thereof or range between any combination of thereof above a top surface of exchanger 160 and/or upper surface 172. Thus, distance D may correspond to the distance between the bottom of the blades of the fan and the top of the heat exchanger 160 and/or vanes 162. As such, in embodiment, springs 380 bias or force fan attachment 130 away from surface 172 such that an upper surface of snap hooks 140 is biased against and inner upper surface of receiving tabs 180 to keep the bottom of the fan blades a height equal to distance D above vanes of heat exchanger 160.

Z-height tolerance springs 380 may have a shape and size, and a material sufficient to bias fan attachment 130 during receiving and engaging of snap hooks 140 by receiving tabs 180 to maintain distance D, such as by resisting reduction of distance D of fan attachment 130 with respect to cap 170. For instance, the force provided by Z-height tolerance springs 380 (e.g., during or while snap hooks engage index tabs) may properly bias fan attachment 130 so that the blades maintain distance D above the top of the exchanger (e.g., vanes) during rotation of fan 120, such as during use of fan 120, during or as a result of a 20 g-30 g forces shock, without damaging the material of Z-height tolerance springs 380.

FIG. 5a is side perspective view of snap hooks of a fan attachment and receiving tabs of a cap. FIG. 5b is another side perspective view of snap hooks of a fan attachment and receiving tabs of a cap. FIGS. 5a and 5b show features, geometry, and surfaces of snap hooks 140 of fan attachment 130; and of receiving tabs 180 of cap 170. Specifically, FIGS. 5a and 5b show fan attachment 130 including outer perimeter surface 132 having vertical slot 342, and pairs of adjacent snap hooks 140 each having wedge shape 136 pointing downwards along and extending outwards from outer perimeter surface 132 on either side of slot 342. Each wedge may be described as located on surface 132 adjacent to or beside slot 342. Also, each pair of adjacent snap hooks may be received by opening 590 and engaged by the surfaces of receiving tab 180 that define opening 590. For example, each pair of snap hooks may have a number of surfaces to be received by and engaged by a number of inner perimeter surfaces that define opening 590. In some cases, the snap hooks or wedge shapes may be defined by the surfaces to be received and engaged. Similarly, openings 590 may be defined by tabs 180 and/or surfaces of tabs 180 to receive and engage surfaces of hooks 140.

In more detail, FIGS. 5a and 5b show each snap hook 140 or wedge shape 136 having top surface 546, outside side surface 548, inside side surface 550 and lower surface 544. Top surface 546 may be parallel (or approximately parallel, such as within 5 degrees of parallel) to top surface 303 of disc shape 301 of the fan attachment. Outside side surface 548 may be perpendicular (or approximately perpendicular, such as within 5 degrees of perpendicular) to top surface 303 and/or to outer perimeter surface 132. Inside side surface 550 may also be perpendicular (or approximately perpendicular, such as within 5 degrees of perpendicular) to top surface 303 and/or to outer perimeter surface 132. Additional descriptions for the surfaces include that lower surface 544 may be described as angled away from outer perimeter surface 132 (e.g. away from the lower edge of surface 132), and may define a rectangular, square, and/or flat surface extending form the edge or surface of surface 132 along an outer edge of the outside side surface 548 and inside side surface 550 to an outer edge of top surface 546. Correspondingly, top surface 546 may be described as disposed away from cap 170 or surface 172 and extending perpendicular to outer perimeter surface 132. Top surface 546 may define a rectangular, square, and/or flat top surface between the upper edges of the outside side surface 548, the inside side surface 550 and the upper edge of the lower surface 544. Outside side surface 548 and inside side surface 550 may be disposed vertically and extend perpendicular to outer perimeter surface 132. For instance, surface 548 and/or surface 550 may define a triangular and/or flat vertical surface between surface 132, an edge of top surface 546, and an edge of lower surface 544. Inside side surfaces 550 may be described as facing or dispose toward each other and/or slot 342 and may form a planar surface extending into and including inner surface 444 of slot 342 (see FIG. 5b).

Correspondingly, receiving tab 180 may include or define inner surfaces 592, bottom inner surface 596, and top inner surface 594. Surfaces 592 may be for receiving, engaging and/or restraining surfaces 548. Bottom inner surface 596 may be for receiving, engaging and/or restraining surfaces 544. Also, top inner surface 594 may be for receiving, engaging and/or restraining surfaces 546. Inner surfaces 592, bottom inner surface 596, and top inner surface 594 may be said to define opening 590.

Receiving tab 180 may also include or define front surface 582, outer top surface 587, outer side surfaces 586, upper surface 584, and back surface 583. Inner surfaces 592 may define a rectangular, square, and/or flat top surface between surface 582 and 583 along an edge of surface 594 and 596. Top inner surfaces 594 and/or bottom inner surface 596 may define a rectangular, square, and/or flat top surface between surface 582 and 583 along an edge of surfaces 592. Surface 596 may be the same surface 172. Front surface 582 and back surface 583 may also be said to define opening 590.

Inner surfaces of or defining opening 590 may be described as corresponding to or matched to surfaces of snap hooks 140. For instance, surface 548 may correspond to surface 544 during indexing and receiving of hooks 140 by tab 180. Also, surfaces 592 and/or surface 594 may correspond to surfaces 548 and/or surface 544, respectively, during indexing, receiving, and engagement of hooks 140 by tab 180.

Upper surface 584 may be angled, cambered, and/or have a shape corresponding to surface 544 to cause hook 140 to be indexed, received, and/or engaged by tab 180 as described herein (e.g., see FIGS. 6a-6C). Surface 587 may be optional, as upper surface 584 may extend from back surface 583 to an edge of front surface 582. Alternatively, surface 587 may exist, such as to define or select an angle, chamber or chamber of surface of 584 with respect to surface 544 of fan attachment 130. Specifically, lower surface 544 may be angled away from the surface of perimeter 132 to cause the orientation, disposition or angle of surface 544 and surface 584 (e.g. a plane defined by the surfaces) to match, correspond, be parallel, or be equal. Moreover, the angle may be selected or angled away such that the first contact between surface 544 and surface 584, during proper receiving, indexing, or alignment creates a contact area of a plane, a line, or a point as designed or selected.

Thus, hook 140 (e.g., the end of aim 135 having the hook) and tab 180 may flex away from each other during receiving and then upon disposition of hook 140 within opening 590 may flex back towards each other so that surface 546 engages surface 594, thus defining engagement of hook 140 by tab 180. It can be appreciated that such engagement may include where surface 594 is matched to, corresponds to, is parallel to, or defines a contact shape of a plane or a line with surface 546.

Similarly, one or both surface(s) 548 may be indexed, oriented or restrained by one or both surface(s) 592 during receiving and then upon disposition of hook 140 within opening 590 so that surface(s) 548 engage surface(s) 592, thus also defining engagement of hook 140 by tab 180. It can be appreciated that such engagement may include where surface(s) 592 are matched to, correspond to, are parallel to, or define a contact shape with surface(s) 548, such as a plane or a line of contact between surface 592 and 548.

FIG. 6a is a cross-sectional schematic view of a snap hook of a fan attachment and the receiving tab of a cap prior to the receiving tab receiving the snap hook. FIG. 6a shows arm 135 of fan attachment 130 having snap hook 140 at a location of outer perimeter 132. Snap hook 140 is shown having top surface 546 and lower surface 544. FIG. 6a also shows cap 170 having receiving tab 180 having upper surface 584, and top inner surface 594 of opening 590. It is considered that FIG. 6a may represent a pair of adjacent snap hooks (e.g., in profile so that only one is showing) of the receiving tab of a cap prior to the receiving tab receiving the snap hook.

It can be appreciated that various surface shapes, textures and angles for upper surface 584 and/or surface 544 can be used or selected to provide indexing, receiving, and/or engaging as described herein. For example, angle A1 of surface 544 from vertical surface of perimeter 132 and angel A2 of surface 584 a horizontal plane can be selected to be complimentary (e.g., to add up to 90 degrees). Alternatively, angle A1 and A2 may in a range of between 5 to 10 degrees from complimentary. Also, angle A1 can be an angel between 30 degrees and 60 degrees. Angle A1 or A2 can be an angle of 35, 40, 45, 50, 55 degrees, or in a range between any of those two numbers in degrees.

FIG. 6b is a cross-sectional schematic view of a snap hook of a fan attachment and a receiving tab of a cap during the receiving tab receiving of the snap hook and prior to the receiving tab engaging the snap hook. FIG. 6b shows receiving tab 180 receiving snap hook 140 such as where contact between surface 544 and 584 defines a contact shape of a plane, a line, or a point. For example, first contact between surfaces 544 and 584 may define a contact shape of a plane or a line. It is considered that FIG. 6b may represent a pair of adjacent snap hooks (e.g., in profile so that only one is showing) of the receiving tab of a cap during the receiving tab receiving the snap hook and prior to the receiving tab engaging the snap hook.

Then, as manual force MF (e.g., see description with respect to FIGS. 1 and 2) forces surface 544 farther down with respect to surface 584, hook 140 (e.g., the end of arm 135 having the hook) and tab 180 may flex away from each other, such as to create a contact shape of a line or point. For example, arm force AF is shown representing the contact force or pressure of hook 140 (e.g., the end of arm 135 having the hook) and tab 180 against each other in the radial direction (e.g., such as inwards, perpendicular to, towards the axis or center of the fan attachment by the tab and away from that axis for the hook) that results from manual force MF during receiving. Force AF may cause arm 135 to flex away or move back (e.g., at the end of the arm where the snap hook is) into opening 134. Force AF may be described as two equal force components, in opposite directions (e.g., at a point of contact between hook 140 and tab 180). Thus, in some cases, saying the snap hook flexes and the arm flexes may be synonymous.

Specifically, FIG. 6b shows flexing FR as a distance that back surface 583 flexes outward from surface 132. Likewise, FIG. 6b shows flexing FS as a total distance that surface 132 flexes away from surface 583. In other words, flexing FR may describe a distance that tab 180 flexes away from hook 140, and flexing FS may describe a distance that hook 140 (e.g., the end of arm 135 having the hook) flexes away from tab 180 due to a force between the hook and the tab at contact shape 610 (e.g., a point or a line of contact). Flexing FR and FS may be described as two equal flexing distances, in opposite directions (e.g., at a point of contact between hook 140 and tab 180). Force AF may be caused by the a shape, size, and/or material of arm 135 and/or tab 180 resisting flexing FR and FS, where flexing FR and FS is caused by manual force MF and/or the shape, angle and/or size of hook 140, surface 544, surface 584, and/or tab 180. For a pair of snap hooks, FR and FS may be the same for each snap hook, however AF required will be double for the pair of snap hooks.

According to embodiments, arm 135, hooks 140, and/or tab 180 may be designed (e.g., have a shape, size, and/or material sufficient) to flex during alignment, receiving (e.g., caused by a manual force) and engaging so that after flexing during receiving, the arm 135, hooks 140, and/or tab 180 can "unflex" or return to its original shape without becoming damaged or permanently deformed (e.g., be able to return to within one to 10 percent of it's original profile, as shown in FIGS. 6a-6c).

FIG. 6c is a cross-sectional schematic view of a snap hook of a fan attachment and a receiving tab of a cap after receiving tab receiving of the snap hook and during receiving tab engaging of the snap hook. FIG. 6c shows hook 140 engaged by tab 180, surfaces of tab 180 and/or defining opening 590. It is considered that FIG. 6c may represent a pair of adjacent snap hooks (e.g., in profile so that only one is showing) of a fan attachment and a receiving tab of a cap after receiving tab receiving of the snap hook and during receiving tab engaging of the snap hook. Specifically, FIG. 6c may represent locating a pair of snap hooks within or between the plurality of corresponding surfaces defining opening 590 of the receiving tab.

As compared to FIG. 6b, the hook and tab may have flexed back towards each other (e.g., the components of force AF, flexing FR, and/or flexing FS are now zero or substantially zero). As compared to FIG. 6a, the hook and tab in FIG. 6c may not be flexed at all. For example, surface 132 may be adjacent to, touching, abutted against, and/or parallel to surface 583. Also, flex FR and/or flex FS (e.g., flexing of arm 135) may be described as being zero in FIG. 6c. Hook 140 being engaged by tab 180 may also include one or both of surfaces 592 of opening 590 engaging corresponding one or both of surfaces 548 of hook 140, such as to resist rotation and/or provide shear resistance of fan attachment 130 with respect to cap 170.

Also, the engagement may include surface 594 engaging surface 546 and/or surface 592 engaging surface 548, such as to prohibit disengagement or detachment of hook 140 from tab 180 or opening 590. This engagement may prohibit disengagement without components becoming damaged, during use (e.g., during rotation of the fan at a speed sufficient to provide cooling), and/or as a result of a 20 g-30 g shock (e.g., a physical shock having a force of between 20 and 30 g-forces to the heat sink). Also, one surface engaging another may be described by the surface being adjacent to or touching, being restrained by, being maintained by, or not moving beyond the other surface.

In other words, the engagement may describe a pair of hooks 140 being secured at a pair of outside side surfaces 548 by a pair of side inner surfaces 592, and/or top surface 546 secured by or engaged by top inner surface 594, such that a pair of snap hooks are restricted from, unable to, or otherwise prohibited from rotating, lifting off of, becoming detached from, or leaving surfaces defining opening 590 without damage, breaking, or bending of snap hooks 140 and/or receiving tab 180. This relationship may also be described as the hooks, a geometry of the hooks, and/or surfaces of the hooks being engaged by the tab, surfaces defining the opening of the tab, and/or the geometry of those surfaces of the tab with sufficient resistance to prohibit disassembly, detachment or disengagement without damaging, breaking or bending the hooks or tab (e.g., at least one hook or tab must be damaged to detach the fan assembly from the cap).

Similarly the engagement may include a pair of hooks 140 being secured at a pair of outside side surfaces 548 by a pair of side inner surfaces 592, and/or top surface 546 secured by or engaged by top inner surface 594, such that a pair of snap hooks are restricted from, unable to, or otherwise prohibited from rotating, lifting off of, becoming detached from, or leaving tab 180, or surfaces defining opening 590 during use, such as during rotation of the fan for cooling. This relationship may also be described as the hooks, a geometry of the hooks, and/or surfaces of the hooks being engaged by the tab, surfaces defining the opening of the tab, and/or the geometry of those surfaces of the tab with sufficient resistance during use, such as during rotation of the fan for cooling, to prohibit disassembly, detachment or disengagement.

Likewise, the engagement may include a pair of hooks 140 being secured at a pair of outside side surfaces 548 by a pair of side inner surfaces 592, and/or top surface 546 secured by or engaged by top inner surface 594, such that a pair of snap hooks are restricted from, unable to, or otherwise prohibited from rotating, lifting off of, becoming detached from, or leaving opening 590 during or as a result of a 20 g-30 g shock. This relationship may also be described as the hooks, a geometry of the hooks, and/or surfaces of the hooks being engaged by the tab, surfaces defining the opening of the tab, and/or the geometry of those surfaces of the tab with sufficient resistance during or as a result of a 20 g-30 g shock, to prohibit disassembly, detachment or disengagement.

The snap hooks, arms, and/or receiving tabs may have a shape, size, and/or material sufficient to provide the indexing, receiving (e.g., flexing) and/or engagement described herein between the snap hooks and receiving tabs (e.g., between the fan attachment and cap). In some cases, the engagement above includes a resistive force (e.g., similar to force AF during receiving) caused by a shape, size, and/or material (e.g., without damaging the material) of arm 135 and/or tab 180 resisting flexing (e.g., similar to resisting flexing FR and FS). This flexing resistance may be in response to or during a manual force to the fan assembly, heat exchanger, components thereof, rotation of fan 120 (e.g., during use of fan 120), a 20 g-30 g shock. Also, this flexing resistance may be caused by or a result of the material, shape, surfaces, angles of surfaces (e.g., of surface 544 and/or surface 584) and/or size of hook 140 and/or tab 180.

For instance, materials included in the snap hooks, arms, and receiving tabs may be plastic, metal, semiconductor, organic material, inorganic material, and polymers. Similarly, materials included may be materials that meet the stated generic material type: Polybutylene Terephthalate (PBT). Materials included may have the following material properties: tensile yield strength 120 megapascals (MPa); percent elongation at break >=4%; Flexural modulus >=7000 MPa; and/or heat deflection (HDT)>=109 degrees Celsius. The material may comprise a thermoplastic polybutylene terephthalate (PBT) twenty percent through thirty percent nylon glass filled (GF) or equivalent, or an equivalent material having critical mechanical material properties including tensile yield strength greater than 120 MPa, percent elongation at break greater than or equal to four percent, flexural modulus greater than or equal to 7,000 MPa and less than equal to 9,800 MPa.

According to some embodiments, edge 620 of hook 140 may not extend out to front surface 582 of tab 180 (e.g., as shown in FIG. 6c). In some cases, edge 620 may not extend radially beyond surface 582 (e.g., surface 546 may be shorter or extend radially outward less distance than surface 594). Alternatively, edge 620 may extend radially beyond surface 582.

It can also be appreciated that spacing tolerances between surfaces, assemblies, features and/or components described above may be included in the systems without detracting from the concepts above. For instance, spacing tolerances, may provide spacing between surfaces of pair of hooks 140 and tabs 180 defining opening 590, such as tolerances to allow for receiving of the hooks by the surfaces defining the opening and engagement of the hooks by the surfaces defining the opening. Specifically, FIG. 6c shows a small gap between surface 594 and surface 596. This gap may be sufficient or necessary for the hook to be properly received and snapped into the surfaces defining opening 590 to provide engagement (e.g., snapped engaged by the receiving tabs). Similarly, the snap hooks and receiving tabs may be designed (e.g., have a shape, size, and/or material sufficient) so that the snap hooks "over travel" when transitioning from being received to being engaged by the surfaces defining the opening. Likewise, concepts described herein consider part tolerances and geometry not being perfect, such as deviations from manufacturing that are known and/or tolerated.

Similarly, it is considered that the descriptions herein for fan attachment 130, cap 170, receiving tab 180, snap hook 140, features and components thereof may be used to attach a fan to various other machines, devices, surfaces, components, and the like for cooling or blowing air, whether or not the cooling or blowing air is for an electronic device. For example, the heat exchanger may be optional, as often the fan is used to directly cool or blow on the electronic device without blowing on the heat exchanger. Thus, the fan attachment and/or fan assembly may blow air onto or be thermally coupled to an electronic device, such as a chip package, semiconductor chip, and/or a processor. In this instance, the features of the heat exchanger assembly may exist on a device that does not have a heat exchanger.

In the foregoing specification, specific embodiments are described. However, various modifications and changes may be made thereto without departing from the broader spirit and scope of embodiments as set forth in the claims. The specification and drawings are, accordingly, to be regarded in an illustrative rather than a restrictive sense.

What is claimed is:

1. A method comprising: engaging a plurality of surfaces of a plurality of pairs of adjacent snap hooks disposed on an adjacent pair of arms defining a portion of a ring shaped outer perimeter surface of a generally disc shape of a fan attachment with a plurality of corresponding surfaces defining a plurality of openings of a plurality of receiving tabs of a heat exchanger, wherein the snap hooks have a wedge shape pointing from a top surface towards a bottom surface of the generally disc shape and extending radially outwards from the outer perimeter surface.

2. The method of claim 1, wherein engaging comprises:
receiving each pair of adjacent snap hooks into the plurality of corresponding surfaces defining an opening of a receiving tab; and
engaging each pair of the snap hooks with the plurality of corresponding surfaces defining the opening of the receiving tab.

3. The method of claim 2, wherein engaging comprises:
engaging a top surface of each snap hook with a top inner surface of the receiving tab;
engaging an outside side surface of each snap hook with a side inner surface of the receiving tab.

4. The method of claim 2, wherein receiving comprises:
flexing a pair of snap hooks away from a receiving tab; and
flexing the receiving tab away from the pair of snap hooks.

5. The method of claim 4, wherein flexing the pair of snap hooks comprises flexing the pair of arms the snap hooks are disposed on away from the receiving tab; and wherein engaging further comprises: locating the pair of snap hooks within or between the plurality of corresponding surfaces defining the opening of the receiving tab; unflexing the pair of arms; unflexing the receiving tab.

6. The method of claim 5, wherein receiving comprises:
manually forcing the snap hooks towards the receiving tabs with between 2 and 3.7 pounds of pressure on an upper portion of the fan attachment.

7. The method of claim 6, wherein engaging comprises:
retaining the pair of snap hooks within the plurality of corresponding surfaces defining the opening of the receiving tab and retaining an alignment of a keying and shear load feature of the fan attachment with an index of the heat exchanger during one rotation of an 86 gram fan attached to the fan attachment at a sufficient speed to provide cooling, and a physical shock having a force of between 20 and 30 g-forces to the heat sink.

8. The method of claim 1, wherein engaging comprises:
manually aligning a keying and shear load feature of the fan attachment with an index of the heat exchanger;
applying a manual force to an upper surface of a fan attached to the fan attachment sufficiently to cause the snap hooks of the fan attachment to be received by and to be snapped engaged by the plurality of corresponding receiving tabs of the heat exchanger.

9. The method of claim 8, wherein applying the manual force comprises applying a sufficient force to cause the four receiving tabs to engage the four pair of the snap hooks, and to cause the four pair of the snap hooks to snap-into or spring snap into the four receiving tabs.

10. The method of claim 1, wherein engaging comprises:
maintaining attachment between the fan attachment and the receiving tab during a 30 g shock to a system board that the receiving tabs are coupled to.

11. A method comprising: snapping a plurality of wedge shaped pairs of adjacent snap hooks disposed on an adjacent pair of arms defining a portion of a ring shaped outer perimeter surface of a generally disc shaped fan attachment into a plurality of corresponding openings of a heat exchanger, wherein the wedge shaped snap hooks decrease in thickness from a top surface towards a bottom surface of the generally disc shape and extend radially outwards from an outer perimeter surface of the generally disc shape.

12. The method of claim 11, wherein snapping comprises engaging a plurality of upper surfaces of the wedge shaped snap hooks with a plurality of corresponding upper surfaces of the openings.

13. The method of claim 12, wherein snapping comprises:
receiving each pair of the adjacent wedge shaped snap hooks into the corresponding surfaces, the corresponding surfaces defining openings of receiving tabs; and
manually forcing the wedge shaped snap hooks towards the receiving tabs with between 2 and 3.7 pounds of pressure applied to the fan attachment.

14. The method of claim 13, wherein snapping comprises:
retaining the pair of snap hooks within the plurality of corresponding surfaces defining the opening of the receiving tab and retaining an alignment of a keying and shear load feature of the fan attachment with an index of the heat exchanger during one rotation of an 86 gram fan attached to the fan attachment at a sufficient speed to provide cooling, and a physical shock having a force of between 20 and 30 g-forces to the heat sink.

15. The method of claim 12, wherein snapping comprises maintaining attachment between the fan attachment and the receiving tab during a 30 g shock to a system board that the receiving tabs are coupled to.

16. A method comprising: engaging a plurality of surfaces of a plurality of pairs of adjacent snap hooks disposed on an adjacent pair of arms defining a portion of a ring shaped outer perimeter surface of a generally disc shape of a fan attachment into a plurality of corresponding surfaces defining a plurality of openings of a plurality of receiving tabs of a heat exchanger, wherein the snap hooks have a wedge shape pointing from a top surface towards a bottom surface of the generally disc shape and extending radially outwards from the outer perimeter surface; receiving each pair of adjacent snap hooks into the plurality of corresponding surfaces defining an opening of a receiving tab, wherein receiving comprises: flexing a pair of snap hooks away from a receiving tab; and flexing the receiving tab away from the pair of snap hooks by manually forcing the snap hooks toward the receiving tabs by applying pressure to an upper portion of the fan attachment.

17. The method of claim 16, wherein engaging comprises:
retaining the pair of snap hooks within the plurality of corresponding surfaces defining the opening of the receiving tab and retaining an alignment of a keying and shear load feature of the fan attachment with an index of the heat exchanger during one rotation of an 86 gram fan attached to the fan attachment at a sufficient speed to provide cooling, and a physical shock having a force of between 20 and 30 g-forces to the heat sink.

18. The method of claim 16, wherein engaging comprises:

manually aligning a keying and shear load feature of the fan attachment with an index of the heat exchanger;

applying a manual force to an upper surface of a fan attached to the fan attachment sufficiently to cause the snap hooks of the fan attachment to be received by and to be snapped engaged by the plurality of corresponding receiving tabs of the heat exchanger.

19. The method of claim 18, wherein applying the manual force comprises applying a sufficient force to cause the four receiving tabs to engage the four pair of the snap hooks, and to cause the four pair of the snap hooks to snap-into or spring snap into the four receiving tabs.

20. The method of claim 16, wherein engaging comprises maintaining attachment between the fan attachment and the receiving tab during a 30 g shock to a system board that the receiving tabs are coupled to.

* * * * *